United States Patent

Kuboi et al.

(10) Patent No.: US 11,476,122 B2
(45) Date of Patent: Oct. 18, 2022

(54) PLASMA ETCHING METHOD AND PLASMA ETCHING APPARATUS

(71) Applicant: Kioxia Corporation, Tokyo (JP)

(72) Inventors: Shuichi Kuboi, Yokohama (JP); Seiya Yoshinaga, Yokohama (JP)

(73) Assignee: Kioxia Corporation, Tokyo (JP)

(*) Notice: Subject to any disclaimer, the term of this patent is extended or adjusted under 35 U.S.C. 154(b) by 0 days.

(21) Appl. No.: 17/010,907

(22) Filed: Sep. 3, 2020

(65) Prior Publication Data

US 2021/0118690 A1 Apr. 22, 2021

(30) Foreign Application Priority Data

Oct. 18, 2019 (JP) .............................. JP2019-191029

(51) Int. Cl.
 *H01L 21/311* (2006.01)
 *H01L 21/67* (2006.01)
 *H01J 37/32* (2006.01)

(52) U.S. Cl.
 CPC .. *H01L 21/31116* (2013.01); *H01J 37/32449* (2013.01); *H01L 21/31144* (2013.01); *H01L 21/67069* (2013.01); *H01J 2237/006* (2013.01); *H01J 2237/3341* (2013.01)

(58) Field of Classification Search
 None
 See application file for complete search history.

(56) References Cited

U.S. PATENT DOCUMENTS

| 5,366,590 | A | 11/1994 | Kadomura | |
|---|---|---|---|---|
| 7,794,616 | B2 | 9/2010 | Honda et al. | |
| 9,859,102 | B2 | 1/2018 | Tahara et al. | |
| 2006/0027530 | A1* | 2/2006 | Honda | C03C 17/23 216/58 |
| 2012/0061769 | A1* | 3/2012 | Sugiyama | H01L 21/31612 257/384 |
| 2013/0295774 | A1* | 11/2013 | Shimizu | H01J 37/32091 438/715 |
| 2017/0243756 | A1* | 8/2017 | Matsuura | H01L 21/31116 |
| 2018/0204728 | A1 | 7/2018 | Oomori et al. | |
| 2019/0051500 | A1 | 2/2019 | Eto et al. | |
| 2019/0057878 | A1* | 2/2019 | Takahashi | C09K 13/00 |
| 2020/0010388 | A1* | 1/2020 | Okamoto | C07C 17/208 |
| 2020/0411293 | A1* | 12/2020 | Tahara | H01L 21/02126 |

FOREIGN PATENT DOCUMENTS

| EP | 3 627 538 A1 | 3/2020 |
|---|---|---|
| JP | 2006-049771 A | 2/2006 |
| JP | 6327295 B2 | 5/2018 |
| JP | 2019-036612 A | 3/2019 |
| WO | WO 2018/212045 A1 | 11/2018 |

* cited by examiner

*Primary Examiner* — Shamim Ahmed
(74) *Attorney, Agent, or Firm* — Oblon, McClelland, Maier & Neustadt, L.L.P.

(57) ABSTRACT

A plasma etching method of an embodiment includes performing etching on a silicon-containing film by using plasma of a fluorocarbon gas. The fluorocarbon gas used in the plasma etching method has a composition, regarding carbon and fluorine, represented by $C_xF_y$, wherein x and y are numbers satisfying $x \geq 7$ and $y \geq x$, and includes a benzene ring structure composed of six carbon atoms.

11 Claims, 6 Drawing Sheets

PLASMA ETCHING METHOD AND PLASMA ETCHING APPARATUS

CROSS REFERENCE TO RELATED APPLICATION

This application is based upon and claims the benefit of priority from Japanese Patent Application No. 2019-191029, filed on Oct. 18, 2019; the entire contents of which are incorporated herein by reference.

FIELD

Embodiments disclosed herein relate to a plasma etching method and a plasma etching apparatus.

BACKGROUND

In a manufacturing process of a semiconductor device, plasma etching is performed for forming a contact hole, a via hole, a trench, or the like on a silicon-containing film such as a silicon oxide film formed on a semiconductor substrate or the like. In the manufacturing process of the semiconductor device, in order to secure an electrical performance and the like of the semiconductor device, precise control of a processing shape, in particular, vertical processing of side walls of a contact hole or the like, is important. For example, a device with three-dimensional structure in recent years has a hole with a large aspect ratio. When forming such a hole with a large aspect ratio by plasma etching, it is desired to increase a hole etching rate per hour and a processing selection ratio with respect to an etching mask, at a low plasma application power.

DETAILED DESCRIPTION

A plasma etching method of an embodiment includes performing etching on a silicon-containing film by using plasma of a fluorocarbon gas. The fluorocarbon gas used in the plasma etching method of the embodiment has a composition, regarding carbon and fluorine, represented by $C_xF_y$, where x and y are numbers satisfying $x \geq 7$ and $y \geq x$, and includes a benzene ring structure composed of six carbon atoms.

Hereinafter, a plasma etching method and a plasma etching apparatus of embodiments will be described while referring to the drawings. Note that in respective embodiments, substantially the same constituent portions are denoted by the same reference numerals, and explanation thereof is sometimes partially omitted. The drawings are schematic, and the relation of thickness and planer dimension, a thickness ratio of the respective parts, and so on may be different from actual ones. The term indicating a direction such as an upper or lower direction in the explanation, indicates a relative direction when a plasma etching surface (processing surface) of a substrate to be described later is faced upward, unless otherwise specified, and is sometimes different from an actual direction based on a gravitational acceleration direction.

Figure 1:
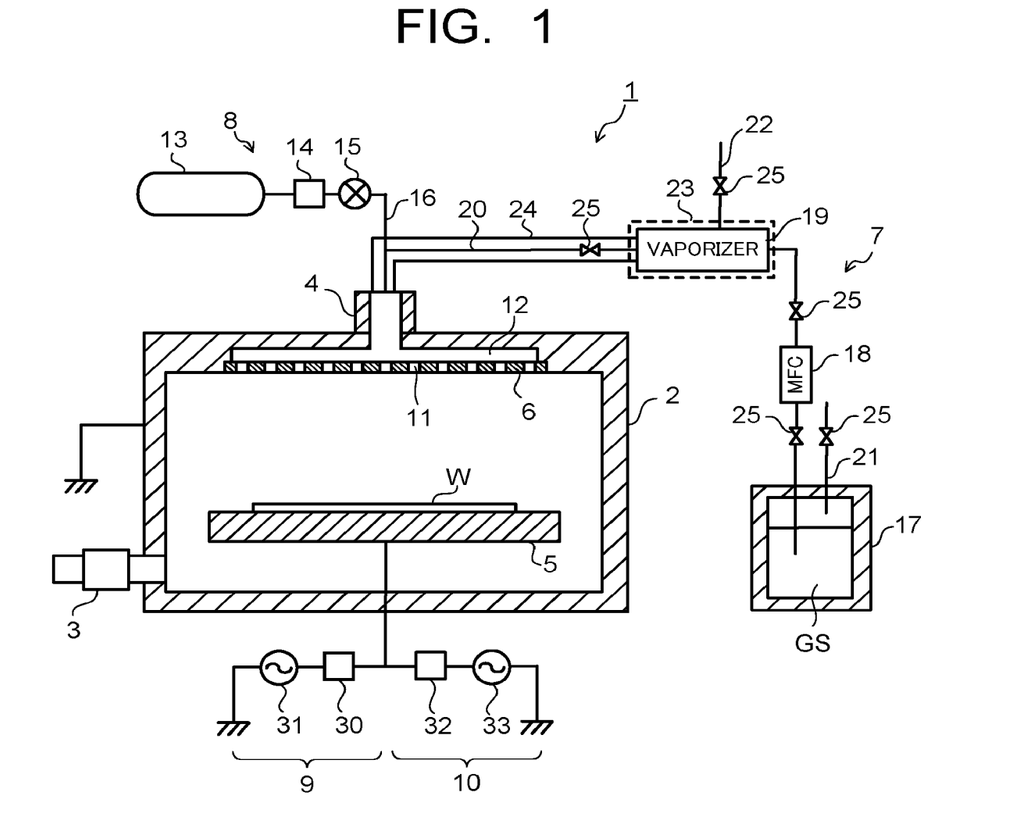
FIG. 1 is a sectional view illustrating a plasma etching apparatus of an embodiment.

FIG. 1 is a sectional view illustrating a plasma etching apparatus according to an embodiment. A plasma etching apparatus 1 illustrated in FIG. 1 is a reactive ion etching (RIE) apparatus of parallel plate type, and includes a chamber 2, an exhaust port 3, a process gas introduction port 4, a lower electrode (substrate electrode) 5, an upper electrode (counter electrode) 6, a first process gas introduction system 7, a second process gas introduction system 8, a first power supply system 9, and a second power supply system 10.

The chamber 2 is provided with the exhaust port 3 and the process gas introduction port 4. The exhaust port 3 is connected to not-illustrated pressure regulating valve, exhaust pump, and the like. The gas in the chamber 2 is exhausted from the exhaust port 3, resulting in that the inside of the chamber 2 is kept at high vacuum. When introducing the process gas from the process gas introduction port 4, by balancing a flow rate of gas which flows in from the process gas introduction port 4 with a flow rate of gas which flows out from the exhaust port 3, it is possible to keep a pressure inside the chamber 2 to a certain vacuum pressure.

To the process gas introduction port 4 of the chamber 2, the first process gas introduction system 7 and the second process gas introduction system 8 are connected. Further, in the chamber 2, a gas introduction space 12 that faces a plurality of gas discharge ports 11 of the upper electrode 6, is provided so as to be connected to the process gas introduction port 4. The first process gas introduction system 7 has a mechanism of vaporizing a process gas raw material in a liquid state or a solid state at room temperature and introducing the vaporized process gas raw material into the chamber 2. The second process gas introduction system 8 is for introducing a process gas in a gaseous state at room temperature into the chamber 2, and has a gas supply source 13, a mass flow controller 14 which controls the gas flow rate, an opening/closing valve 15, and a pipe 16. One end of the pipe 16 is connected to the gas supply source 13, and the other end of the pipe 16 is connected to the process gas introduction port 4. As the process gas in a gaseous state at room temperature, for example, a noble gas of He, Ar, Kr, or Xe, a gas of $N_2$, $O_2$, $H_2$, CO $NF_3$, $SF_6$, $CH_4$, or the like, a general $C_xF_y$ gas such as $CF_4$, $C_4F_6$, $C_4F_8$, or the like, and a $C_xH_yF_z$ gas such as $CHF_3$, $CH_2F_2$, $CH_3F$, or the like, are used.

The first process gas introduction system 7 has a raw material tank 17 that accommodates a process gas raw material GS in a liquid state, a liquid flow rate controller 18, a vaporizer 19 that vaporizes the process gas raw material GS in a liquid state, and a pipe 20 that connects these raw material tank 17, liquid flow rate controller 18, and vaporizer 19. One end of the pipe 20 is opened to the inside of the raw material tank 17, and the other end of the pipe 20 is connected to the process gas introduction port 4. To the raw material tank 17, an inert gas supply line 21 is connected. To the vaporizer 19, a carrier gas supply line 22 that supplies a carrier gas for feeding the vaporized component of the process gas raw material GS (process gas) into the chamber 2, is connected. A periphery of the vaporizer 19 is covered by a heat insulating material 23. Further, a heater 24 is provided to a periphery of the pipe 20 from the vaporizer 19 to the process gas introduction port 4 so that the vaporized component of the process gas raw material GS is not liquefied in the pipe 20. To each of the pipe 20, the inert gas supply line 21, and the carrier gas supply line 22, an opening/closing valve 25 is provided according to the predetermined place.

In the first process gas introduction system 7, when the inert gas is supplied to the raw material tank 17 from the inert gas supply line 21, the process gas raw material GS is fed to the vaporizer 19 via the liquid flow rate controller 18. The process gas raw material GS in a liquid state with a flow rate controlled by the liquid flow rate controller 18, is vaporized by the vaporizer 19. Since the flow rate of the process gas raw material GS in a liquid state is already controlled by the liquid flow rate controller 18, the vaporized component of the process gas raw material GS vaporized by the vaporizer 19, is fed, as a predetermined gas flow rate, into the chamber 2 via the process gas introduction port 4. The process gas raw material GS in a liquid state and the vaporized component thereof will be described later in detail.

Figure 2:
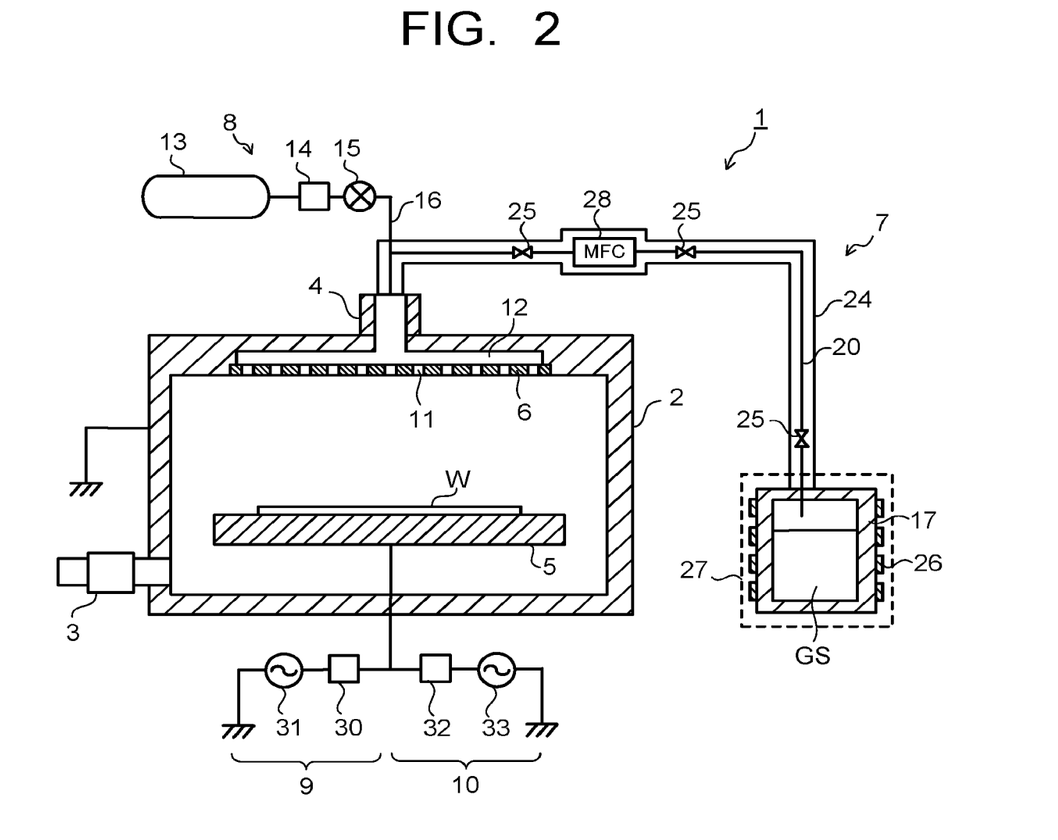
FIG. 2 is a sectional view illustrating a modified example of the plasma etching apparatus of the embodiment.

The mechanism of vaporizing the process gas raw material GS is not limited to the configuration using the vaporizer 19 illustrated in FIG. 1. It is also possible to design such that, as illustrated in FIG. 2, the raw material tank 17 that accommodates the process gas raw material GS in a liquid state or a solid state is directly heated, to thereby vaporize the process gas raw material GS in a liquid state or a solid state. Specifically, in the first process gas introduction system 7 illustrated in FIG. 2, a heater 26 is provided to a periphery of the raw material tank 17 that accommodates the process gas raw material GS in a liquid state or a solid state, and a periphery of the raw material tank 17 and the heater 26 is covered by a heat insulating material 27. The pipe 20 from the raw material tank 17 to the process gas introduction port 4 is provided with a gas flow rate controller 28. The heater 24 is provided to a periphery of the pipe 20 and the gas flow rate controller 28.

In the first process gas introduction system 7 illustrated in FIG. 2, the raw material tank 17 that accommodates the process gas raw material GS in a liquid state or a solid state, is directly heated by the heater 26. The process gas raw material GS in a liquid state or a solid state heated by the heater 26 is vaporized and fed to the pipe 20. A flow rate of the vaporized component of the process gas raw material GS is controlled by the gas flow rate controller 28, and in this state, the vaporized component is fed into the chamber 2 via the process gas introduction port 4.

In the chamber 2, there is provided the lower electrode (first electrode) 5 as a substrate electrode which is vertically movable and which also functions as a mounting table (holding part) on which a substrate such as a semiconductor wafer W is mounted. It is configured such that on an upper part of the lower electrode 5, a not-illustrated electrostatic chuck is provided, so that the semiconductor wafer W can be held by the lower electrode 5. At a position above the lower electrode 5, the upper electrode (second electrode) 6 which also functions as a shower head for process gas discharge is arranged, as a counter electrode, by facing the lower electrode 5, so as to divide the gas introduction space 12 and a processing space where etching process of the semiconductor wafer W is performed. To the upper electrode 6, a plurality of gas discharge holes 11 are provided to make the process gas to be supplied from the gas introduction space 12 to the processing space of the semiconductor wafer W. The chamber 2 is grounded.

To the lower electrode 5 as the substrate electrode, the first power supply system 9 and the second power supply system 10 are connected. The first power supply system 9 has a matching device 30 and a first high-frequency power supply 31, and the second power supply system 10 has a matching device 32 and a second high-frequency power supply 33. The first high-frequency power supply 31 is a power supply that outputs a first high-frequency voltage (Va) for ionizing the process gas to generate plasma, and the output first high-frequency voltage (Va) is applied to the lower electrode 5. The second high-frequency power supply 33 is a power supply that outputs a second high-frequency voltage (Vb) for attracting ions from plasma to the semiconductor wafer W, a frequency of the second high-frequency voltage (Vb) being lower than that of the first high-frequency voltage (Va), and the output second high-frequency voltage (Vb) is applied to the lower electrode 5. Both the voltage Va and the voltage Vb are generally referred to as high-frequency voltages, but, in order to explain the difference in the respective frequencies, the first high-frequency voltage (Va) is referred to as an RF high-frequency voltage, and the second high-frequency voltage (Vb) is referred to as an RF low-frequency voltage, as a matter of convenience.

The RF high-frequency voltage (Va) output by the first high-frequency power supply 31 is preferably 27 MHz or more for increasing a power of generating plasma, and is preferably 100 MHz, 60 MHz, 40 MHz, 27 MHz, or the like, for example. The RF low-frequency voltage (Vb) output by the second high-frequency power supply 33 is preferably 3 MHz or less for increasing the ion attraction from plasma, and is preferably 3 MHz, 2 MHz, 400 kHz, 100 kHz, or the like, for example. Further, a voltage between an upper peak and a lower peak of the RF low-frequency voltage (Vb) which is applied from the second high-frequency power supply 33 to the lower electrode 5, is preferably 1000 V or more.

The process gas is introduced from the first process gas introduction system 7 into the chamber 2, the process gas is introduced from the second process gas introduction system 8 into the chamber 2 according to need, and at the same time, the RF high-frequency voltage (Va) and the RF low-frequency voltage (Vb) are applied to the lower electrode 5 from the above-described first high-frequency power supply 31 and second high-frequency power supply 33, respectively, resulting in that plasma is generated between the lower electrode 5 and the upper electrode 6. Specifically, when the RF high-frequency voltage (Va) from the first high-frequency power supply 31 and the RF low-frequency voltage (Vb) from the second high-frequency power supply 33 are superposed to be applied to the lower electrode 5, the process gas is ionized to form plasma of the process gas between the lower electrode 5 and the upper electrode 6, and ions are attracted toward the lower electrode 5 side.

Next, a plasma etching method of the semiconductor wafer W by using the above-described plasma etching apparatus 1 will be described. In a plasma etching method of an embodiment, a substrate such as a semiconductor wafer W to be subjected to etching process is first mounted on the lower electrode 5. The semiconductor wafer W to be subjected to the etching process, has a silicon-containing film such as a silicon oxide film (SiO film), a silicon nitride film (SiN film), or a silicon oxynitride film (SiON film) formed on a semiconductor film or a metal film containing at least one selected from a group consisting of silicon, tungsten, aluminum, titanium, molybdenum, and tantalum. An etching mask is formed on the semiconductor wafer W having such a silicon-containing film, the etching mask is subjected to patterning to form an opening, and then plasma etching process is performed, to thereby form a hole portion such as a contact hole on the silicon-containing film in accordance with the opening of the etching mask.

When forming the contact hole or the like on the silicon-containing film, the process gas is introduced from the first process gas introduction system 7 into the chamber 2, and at the same time, the RF high-frequency voltage (Va) and the RF low-frequency voltage (Vb) are applied from the first high-frequency power supply 31 and the second high-frequency power supply 33, respectively, to the lower electrode 5 on which the semiconductor wafer W formed with the etching mask is mounted, to thereby generate plasma between the lower electrode 5 and the upper electrode 6, and ions in the plasma are attracted to the semiconductor wafer W, to thereby perform etching process on the silicon-containing film. The etching process of the silicon-containing film is performed on at least the SiO film. The silicon-containing film to be subjected to the plasma etching process is not limited to a single film of SiO film, and it may also be a stacked film of the SiO film and the SiN film. In the etching process of the silicon-containing film, it is possible to selectively process the silicon-containing film based on a difference in etching rate between the silicon-containing film and the aforementioned semiconductor film or metal film.

In the plasma etching process of the silicon-containing film described above, as the process gas raw material GS which is accommodated in the raw material tank 17 of the first process gas introduction system 7, a raw material of fluorocarbon having a composition, regarding carbon and fluorine, represented by $C_xF_y$ (x and y are numbers satisfying $x \geq 7$ and $y \geq x$), and including a benzene ring structure composed of six carbon atoms, is used. The fluorocarbon including the above-described composition and benzene ring structure (referred to as benzene ring-based fluorocarbon, hereinafter) is in a liquid state at room temperature, so that the mechanism of vaporizing the process gas raw material GS in a liquid state, as illustrated in each of FIG. 1 and FIG. 2, is used.

The above-described benzene ring-based fluorocarbon has the benzene ring structure which is more stabilized and thus is more unlikely to be decomposed when compared to a molecular structure of conventional fluorocarbon, so that it is possible to increase a processing selection ratio with respect to an etching mask. In addition to such a characteristic of the benzene ring-based fluorocarbon, the carbon number x of the $C_xF_y$ composition is 7 or more and the fluorine number y is equal to or more than the carbon number x, so that a group containing carbon and fluorine bonded to at least one of the six carbon atoms composing the benzene ring, is likely to be separated from the benzene ring in the plasma to be ionized. When the group containing carbon and fluorine, which is separated from the benzene ring, is ionized, an excellent etching effect is exhibited. Therefore, when performing etching on the silicon-containing film such as the silicon oxide film (SiO) formed on the semiconductor wafer W, it is possible to increase an etching rate, for example, a hole etching rate, at a low plasma application power.

In order to obtain the processing selectivity with respect to the etching mask and the hole etching rate as described above, the benzene ring-based fluorocarbon preferably has a structure in which a substituent including at least one selected from a $CF_3$ group, a $CF_2$ group, and a CF group (referred to as a $CF_z$-containing group, hereinafter) is bonded to at least one of the six carbon atoms composing the benzene ring. The $CF_z$-containing group is not limited to a single group of the aforementioned $CF_3$ group, $CF_2$ group, and CF group, and it is also possible that a $C_mF_n$ group (each of m and n is a number of one or more) is bonded to the carbon atom of the benzene ring, and such a $C_mF_n$ group includes at least one selected from the $CF_3$ group, the $CF_2$ group, and the CF group. The $C_mF_n$ group may be, for example, a group having a double bond of carbon-carbon such as "—C(F)=CF$_2$" or "—C(F$_2$)—C(F)=CF$_2$", a group in which an alkyl fluoride group is bonded to a carbon atom such as "—C(F)(CF$_3$)$_2$", a group in which fluorine is bonded to a carbon chain having a plurality of single bond, double bond, and triple bond of carbon-carbon, or the like, and a form thereof is not particularly limited. Note that the $C_mF_n$ group is not limited to a perfluorocarbon group, and it may also be a group in which a part thereof is substituted by hydrogen or oxygen. Specifically, the aforementioned benzene ring-based fluorocarbon may be not only one having the composition represented by $C_mF_n$, but also one represented by a composition formula which further includes one or more of H or O.

Figure 3:
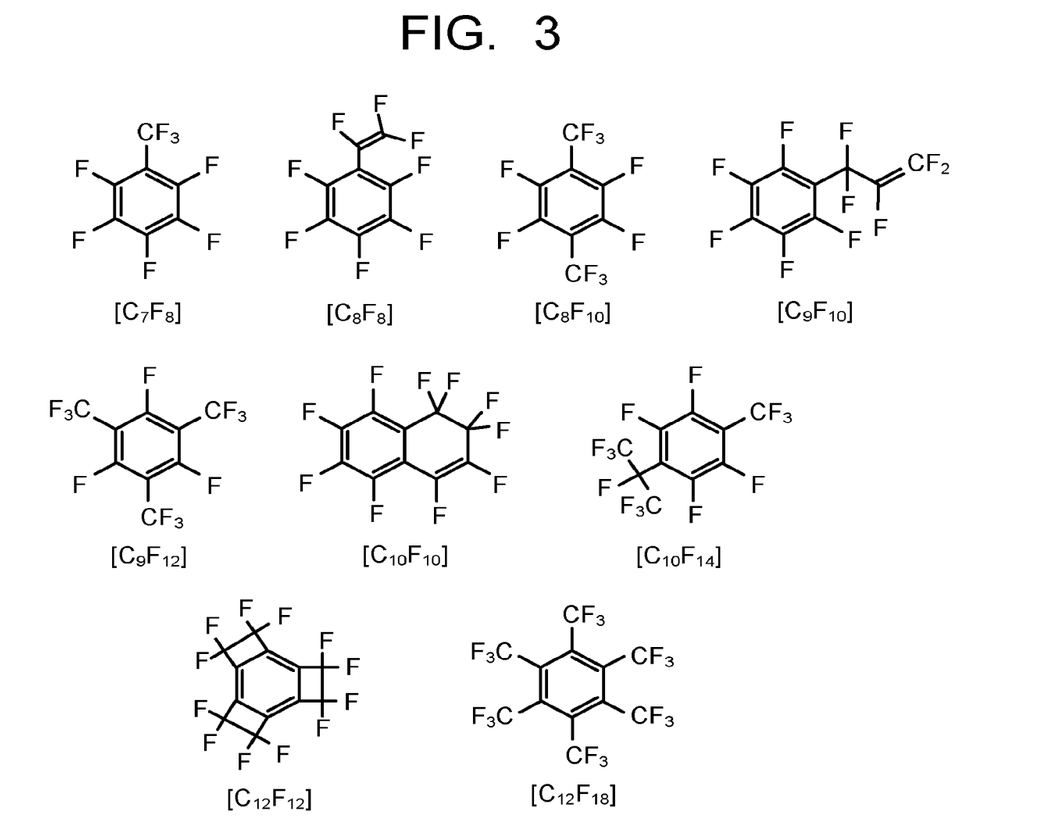
FIG. 3 is a view illustrating examples of fluorocarbon gas used for a plasma etching method of an embodiment.

As concrete examples of the benzene ring-based fluorocarbon as described above, there can be cited $C_7F_8$, $C_8F_8$, $C_8F_{10}$, $C_9F_{10}$, $C_9F_{12}$, $C_{10}F_{10}$, $C_{10}F_{14}$, $C_{12}F_{12}$, $C_{12}F_{18}$, and the like. Examples of structures of these benzene ring-based fluorocarbons are illustrated in FIG. 3. As illustrated in FIG. 3, in each of the examples, a group including at least one selected from the $CF_3$ group, the $CF_2$ group, and the CF group ($CF_z$-containing group) is bonded to at least one of the six carbon atoms composing the benzene ring, and when each of these $CF_z$-containing groups or a part thereof is separated from the benzene ring in the plasma to be ionized, it is possible to increase the hole etching rate. Further, since the $CF_z$-containing group is easily separated from the benzene ring, it is possible to increase the hole etching rate at a low plasma application power. As described above, the process gas which is introduced into the chamber 2 from the first process gas introduction system 7 preferably includes at least one selected from the group consisting of the $C_7F_8$ gas, the $C_8F_8$ gas, the $C_8F_{10}$ gas, the $C_9F_{10}$ gas, the $C_9F_{12}$ gas, the $C_{10}F_{10}$ gas, the $C_{10}F_{14}$ gas, the $C_{12}F_{12}$ gas, and the $C_{12}F_{18}$ gas.

Figure 4:
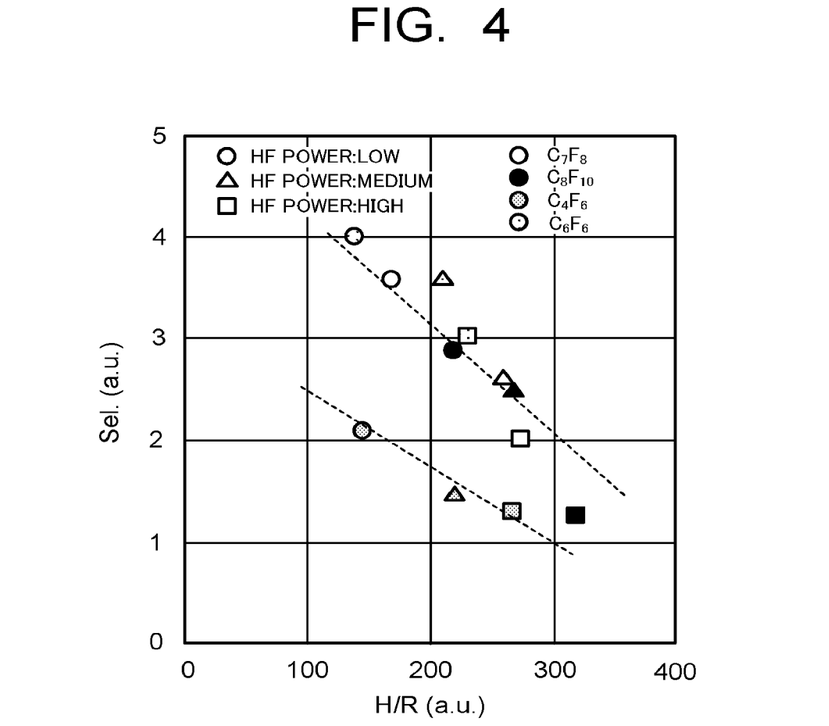
FIG. 4 is a view illustrating one example of a relation of a processing selection ratio with respect to an etching mask, with respect to a hole etching rate of the fluorocarbon gas used for the plasma etching method of the embodiment.
Figure 5:
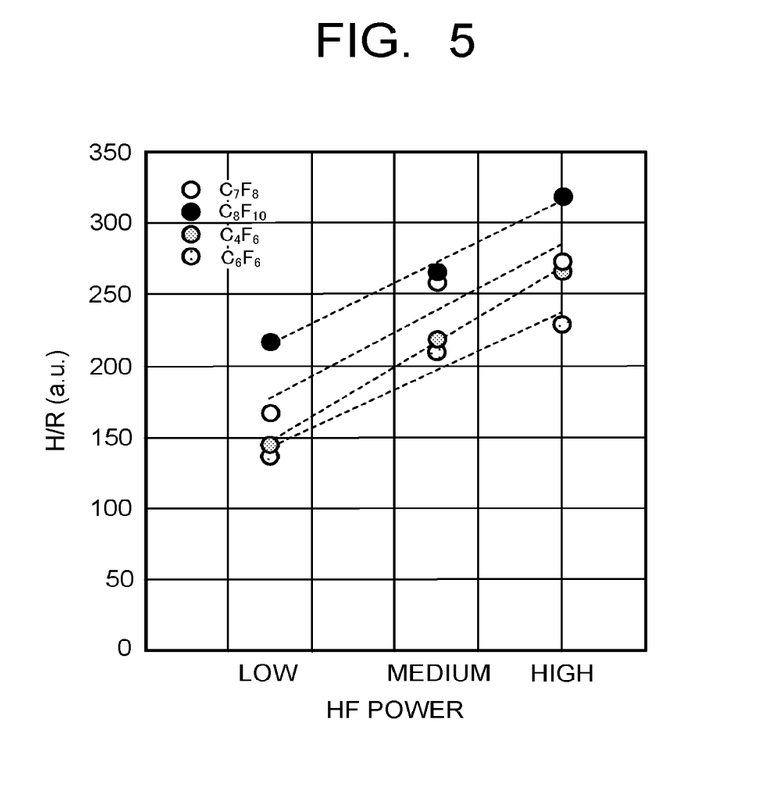
FIG. 5 is a view illustrating one example of a relation of a hole etching rate of the fluorocarbon gas used for the plasma etching method of the embodiment with respect to a plasma application power.
Figure 6:
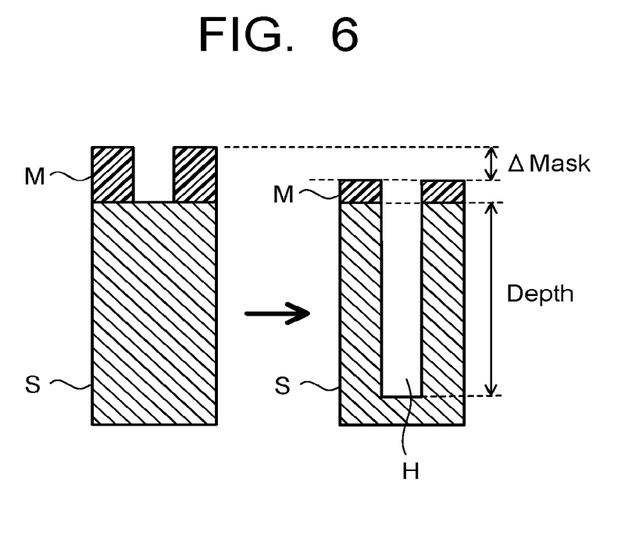
FIG. 6 is a view for explaining the hole etching rate and the processing selection ratio with respect to the etching mask in FIG. 4 and FIG. 5.

FIG. 4 illustrates one example of a relation of a processing selection ratio (Sel.) with respect to an etching mask, with respect to a hole etching rate (H/R) of the vaporized component of the benzene ring-based fluorocarbon (fluorocarbon gas). FIG. 5 illustrates one example of a relation of the hole etching rate (H/R) of the vaporized component of the benzene ring-based fluorocarbon (fluorocarbon gas) with respect to a plasma application power of the first high-frequency power supply 31 (HF power). As illustrated in FIG. 6, the hole etching rate (H/R) indicates a value as a result of dividing a depth of a hole H (Depth) by a processing time (time). The processing selection ratio (Sel.) with respect to the etching mask indicates a value as a result of dividing a reduced thickness of a mask M during the processing (ΔMask) by the depth of the hole H (Depth). In FIG. 6, S indicates a silicon-containing film.

FIG. 4 and FIG. 5 illustrate characteristics of the $C_7F_8$ gas and the $C_8F_{10}$ gas, as examples of the fluorocarbon gas. FIG. 4 and FIG. 5 additionally illustrate characteristics of a $C_4F_6$ gas and a $C_6F_6$ gas, for comparison. As illustrated in FIG. 4, the processing selection ratio (Sel.) with respect to the etching mask, with respect to the hole etching rate (H/R) of each of the $C_7F_8$ gas and the $C_8F_{10}$ gas is approximately equal to that of the $C_6F_6$ gas, but is better than that of the $C_4F_6$ gas. When compared to the $C_4F_6$ gas and the $C_6F_6$ gas, the $C_7F_8$ gas and the $C_8F_{10}$ gas obtain a better hole etching rate (H/R) at a low plasma application power (HF power).

As illustrated in FIG. 4 and FIG. 5, with the use of the fluorocarbon gas composed of the vaporized component of the benzene ring-based fluorocarbon, it is possible to increase the hole etching rate and the processing selection ratio with respect to the etching mask, at a low plasma application power. Therefore, it becomes possible to form the contact hole or the like with a large aspect ratio on the SiO film or the stacked film of the SiO film and the SiN film, for example, at a low plasma application power.

Besides, since the fluorocarbon gas composed of the vaporized component of the benzene ring-based fluorocarbon has the etching rate of the silicon-containing film larger than the etching rate of the metal film of tungsten (W) or the like, it is possible to selectively process the silicon-containing film. For example, when the hole etching rate of W when using the $C_4F_6$ gas is set to 1, the hole etching rate of W when using the $C_7F_8$ gas is 0.63, and the etching rate of the silicon-containing film is larger than the etching rate of the tungsten film. Therefore, it is possible to selectively process the silicon-containing film. Note that the hole etching rate of W is based on a comparison of an etching amount of the W film with respect to a hole of unit $SiO_2$.

Note that the configurations of the aforementioned respective embodiments can be mutually combined to be carried out, and a part thereof can be substituted. Here, while certain embodiments of the present invention have been described, these embodiments have been presented by way of example only, and are not intended to limit the scope of the inventions. The novel embodiments described herein may be embodied in a variety of other forms; furthermore, various omissions, substitutions, changes, and so on may be made therein without departing from the spirit of the inventions. The accompanying claims and their equivalents are intended to cover such forms or modifications as would fall within the scope and spirit of the inventions.

What is claimed is:

1. A plasma etching method, comprising
performing etching on a silicon-containing film by using plasma of a fluorocarbon gas, wherein
the fluorocarbon gas has a composition, regarding carbon and fluorine, represented by $C_xF_y$, wherein x and y are numbers satisfying x≥7 and y≥x, and includes a benzene ring structure composed of six carbon atoms.

2. The method according to claim 1, wherein
the fluorocarbon gas has a structure in which a substituent including at least one selected from the group consisting of a $CF_3$ group, a $CF_2$ group, and a CF group is bonded to at least one carbon atom in the benzene ring.

3. The method according to claim 1, wherein
the fluorocarbon gas has a structure in which a fluorocarbon group represented by $C_mF_n$ regarding carbon and fluorine is bonded to at least one carbon atom in the benzene ring, wherein m and n are numbers of one or more.

4. The method according to claim 3, wherein
the fluorocarbon group further includes at least one selected from the group consisting of hydrogen and oxygen.

5. The method according to claim 1, wherein
the fluorocarbon gas includes at least one selected from the group consisting of a $C_7F_8$ gas, a $C_8F_8$ gas, a $C_8F_{10}$ gas, a $C_9F_{10}$ gas, a $C_9F_{12}$ gas, a $C_{10}F_{10}$ gas, a $C_{10}F_{14}$ gas, a $C_{12}F_{12}$ gas, and a $C_{12}F_{18}$ gas.

6. The method according to claim 1, wherein
the silicon-containing film includes at least one selected from the group consisting of a silicon oxide film, a silicon nitride film, and a silicon oxynitride film.

7. The method according to claim 1, further comprising
vaporizing a raw material in a liquid state or a solid state of fluorocarbon; and generating plasma of a vaporized component of the raw material, etching on the silicon-containing film being performed by using the plasma of the vaporized component.

8. The method according to claim 1, wherein:
the silicon-containing film has a silicon oxide film or a stacked film of the silicon oxide film and a silicon nitride film formed on a semiconductor substrate; and
the performing of etching on the silicon-containing film includes: forming an etching mask having an opening, on the silicon-containing film; arranging the semiconductor substrate having the silicon-containing film in a chamber; forming the plasma of the fluorocarbon gas in the chamber; and forming a hole according to the opening in the silicon-containing film by using the plasma.

9. The method according to claim 8, wherein
the forming of the plasma includes applying a high-frequency voltage between a first electrode arranged in the chamber and on which the semiconductor substrate is placed, and a second electrode arranged in the chamber so as to face the first electrode.

10. The method according to claim 1, wherein
the etching on the silicon-containing film is performed by using plasma of a combination of the fluorocarbon gas and at least one selected from the group consisting of a He gas, an Ar gas, a Kr gas, a Xe gas, a $N_2$ gas, an $O_2$ gas, a $H_2$ gas, a CO gas, a $NF_3$ gas, a $SF_6$ gas, a $CH_4$ gas, a $CF_4$ gas, a $C_4F_6$ gas, a $C_4F_8$ gas, a $CHF_3$ gas, a $CH_2F_2$ gas, and a $CH_3F$ gas.

11. The method according to claim 1, wherein
the fluorocarbon gas includes at least one selected from the group consisting of a $C_7F_8$ gas, a $C_8F_{10}$ gas, a $C_9F_{10}$ gas, a $C_9F_{12}$ gas, a $C_{10}F_{10}$ gas, a $C_{10}F_{14}$ gas, a $C_{12}F_{12}$ gas, and a $C_{12}F_{18}$ gas.

* * * * *